US008436646B1

(12) United States Patent
Mendel et al.

(10) Patent No.: US 8,436,646 B1
(45) Date of Patent: May 7, 2013

(54) RECONFIGURABLE LOGIC BLOCK WITH USER RAM

(75) Inventors: David W. Mendel, Sunnyvale, CA (US); Triet M. Nguyen, San Jose, CA (US); Lu Zhou, Santa Clara, CA (US); Gary Lai, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 69 days.

(21) Appl. No.: 13/175,662

(22) Filed: Jul. 1, 2011

(51) Int. Cl.
*H03K 19/173* (2006.01)
(52) U.S. Cl.
USPC .................................. 326/38; 326/41; 326/47
(58) Field of Classification Search .............. 326/37–41, 326/47
See application file for complete search history.

(56) References Cited

U.S. PATENT DOCUMENTS

2005/0071730 A1* 3/2005 Moyer et al. .................. 714/758

\* cited by examiner

*Primary Examiner* — Jany Richardson
(74) *Attorney, Agent, or Firm* — Weaver Austin Villeneuve & Sampson LLP

(57) ABSTRACT

A programmable logic device includes logic blocks such as a logic array blocks (LAB) that can be configured as a random access memory (RAM) or as a lookup table (LUT). A mode flag is provided to indicate the mode of operation of configuration logic such as a configuration RAM (CRAM) used during partial reconfiguration of a logic block. If the mode flag indicates a design state, the configuration logic associated with the logic block is included in data verification and correction processes. If the mode flag indicates a user defined state, the configuration logic associated with the logic block is excluded from data verification and correction processes. Thus, exclusion and inclusion of portions of a region of configuration logic from data verification and correction processes allow a region of configuration logic to store both a design state and a user defined state without causing deleterious effects.

19 Claims, 6 Drawing Sheets

RECONFIGURABLE LOGIC BLOCK WITH USER RAM

TECHNICAL FIELD

The present disclosure generally relates to integrated circuits. More specifically, the present disclosure relates to techniques and systems for implementing an integrated circuit.

DESCRIPTION OF RELATED ART

A programmable logic device (PLD) is a semiconductor integrated circuit that contains logic circuitry that can be programmed to perform a host of logic functions. In a typical scenario, a logic designer uses computer-aided design (CAD) tools to design a custom logic circuit. These tools use information regarding the hardware capabilities of a given programmable logic device to help the designer implement the custom logic circuit using multiple resources available on that given programmable logic device. In many instances, a programmable logic device may support partial reconfiguration or the ability to have part of its logic reconfigured to other functionalities while other parts of the PLD remain active. However, mechanisms for performing partial reconfiguration are limited and hindered.

SUMMARY

A device, such as a programmable logic device, includes logic blocks such as a logic array block (LAB) that can be configured as a random access memory (RAM) or as a lookup table (LUT). The device may comprise a logic block, wherein the logic block includes a plurality of logic elements. The device may further comprise configuration logic associated with the logic block, wherein the configuration logic stores values for the plurality of logic elements included in the logic block. The device may also comprise a memory cell storing a mode flag, wherein the mode flag identifies whether the configuration logic stores a user defined state or a design state, wherein the configuration logic is excluded from a data verification and correction process when storing a user defined state, and wherein the configuration logic is included in the data verification and correction process when storing a design state.

In various embodiments, excluding the configuration logic from the data verification and correction process prevents the data verification and correction process from modifying the configuration logic. In particular embodiments, the mode flag is positioned to minimize the time between scanning of the mode flag and scanning of the configuration logic associated with the mode flag during the data verification and correction process. In some embodiments, the mode flag is protected by triple modular redundancy, larger gate area, protective capacitors, or the use of increased voltage. In various embodiments, the logic block operates as user-defined random access memory or as a shift register in response to the configuration logic storing a user defined state. In particular embodiments, the logic block is a look-up-table (LUT) based logic block and the memory cell is a random access memory cell, a latch, or a register. In some embodiments, the mode flag comprises a single bit of data.

In another aspect, the device may comprise a plurality of logic blocks, wherein each of the plurality of logic blocks includes a plurality of logic elements. The device may further comprise configuration logic associated with the plurality of logic blocks, wherein the configuration logic stores values for a plurality of logic elements included in a logic block, and wherein the configuration logic is stored within a configuration random access memory (CRAM) cell array including a plurality of columns of CRAM cells. The configuration logic may include a plurality of subsets of configuration logic, each of the plurality of subsets of configuration logic being associated with one of the plurality of logic blocks. Each of the plurality of subsets of configuration logic may include a memory cell storing a mode flag, wherein the mode flag identifies whether the configuration logic stores a user defined state or a design state, wherein the configuration logic is excluded from a data verification and correction process when storing a user defined state, and wherein the configuration logic is included in the data verification and correction process when storing a design state.

In various embodiments, the configuration logic occupies more than one column of CRAM cells in the CRAM cell array. In particular embodiments, the mode flag identifies whether configuration logic associated with a plurality of logic blocks stores a user defined state or a design state. In some embodiments, the mode flag is positioned to minimize the instances of errors in the value stored in the mode flag that may occur during the time between scanning of the mode flag and scanning of the configuration logic associated with the mode flag during the data verification and correction process. In various embodiments, a subset of the configuration logic is stored in a column of CRAM other than the column of CRAM storing the mode flag associated with the subset of configuration logic. In particular embodiments, the logic block, configuration logic, and memory cell are operable to transition between a design state and a user defined state without causing verification errors by changing values stored in the configuration logic from a user defined state to a known state in response to an input provided by a user, and by reading out a known state during the data verification and correction process in response to an input provided by a user.

In another aspect, a method for reconfiguring configuration logic storing values that identify values of a plurality of logic elements included in a logic block is provided. The method may comprise reading a mode flag associated with configuration logic and determining whether the mode flag indicates that a user defined state is stored in configuration logic. In response to determining that the mode flag indicates a user defined state, the method may further comprise reading out the values stored in the configuration logic as a known state, computing an error check code associated with the values stored in the configuration logic based on the known state, reading out the values of a verification code associated with the configuration logic as a known state, and comparing the error check code to the verification code. In various embodiments, the method may further include determining whether the mode flag indicates that a design state is stored in the configuration logic. In response to determining that the mode flag indicates a design state, the method may further comprise, reading out values stored in the configuration logic, modifying the values stored in the configuration logic to create modified configuration logic values, computing a verification code based on the modified configuration logic values, and writing the modified configuration logic values to a CRAM cell array.

DESCRIPTION OF PARTICULAR EMBODIMENTS

Figure 1:
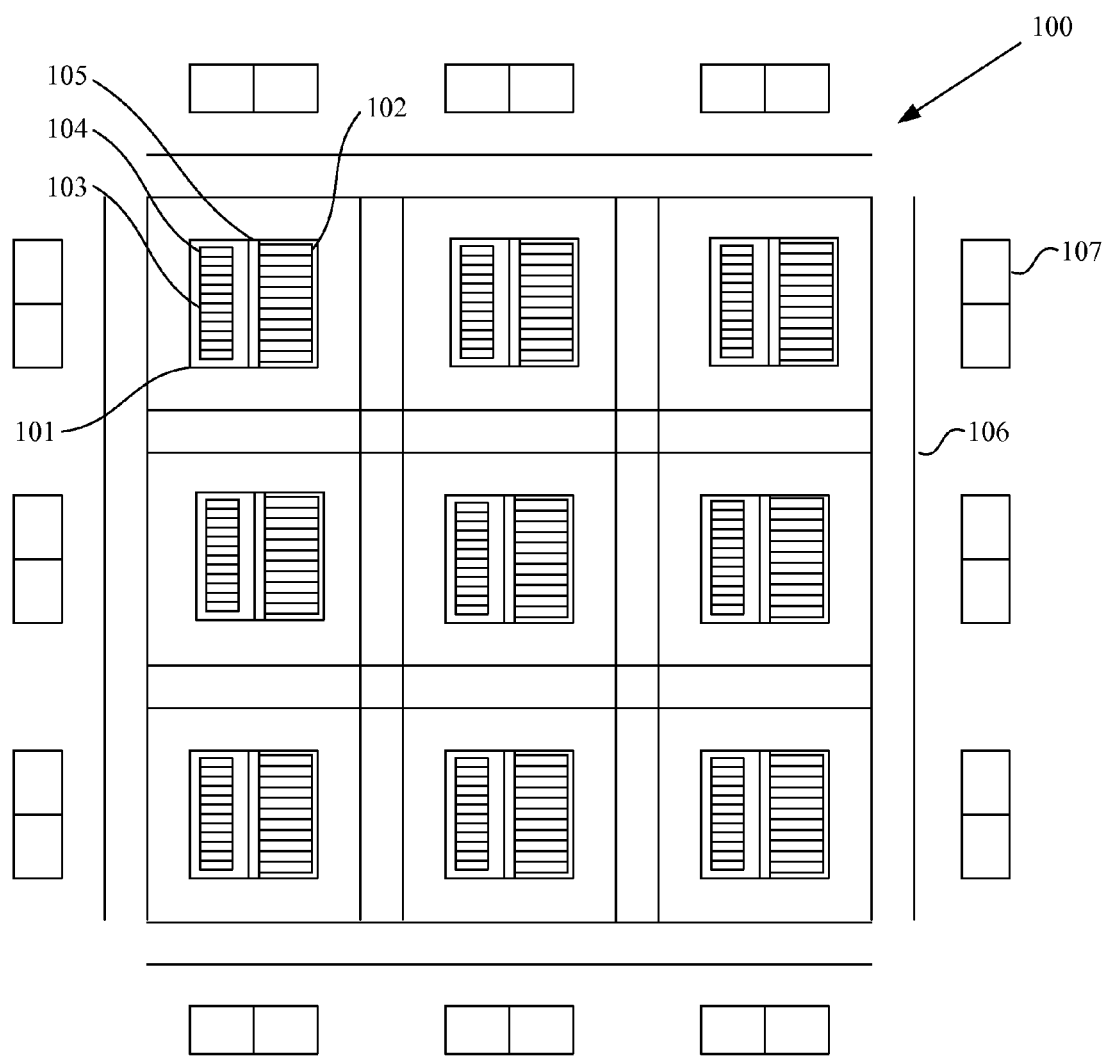
FIG. 1 is a schematic of a programmable logic device that may be used during partial reconfiguration.

Reference will now be made in detail to embodiments of the present invention contemplated by the inventors for carrying out the invention. Examples of these embodiments are illustrated in the accompanying drawings. While the invention is described in conjunction with these embodiments, it will be understood that the invention is not intended to be limited to the described embodiments. On the contrary, the invention is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

A programmable logic device (PLD) is a semiconductor integrated circuit that contains logic circuitry that can be programmed to perform a host of logic functions. The PLD may be reconfigured to incorporate additional functionalities by changing configuration logic such as a configuration random access memory (CRAM) associated with the PLD. The configuration logic may be organized in a configuration random access memory (CRAM) cell array comprising rows and columns of CRAM cells that undergo periodic data verification and correction. During data verification and correction processes, values stored within columns of CRAM cells within the CRAM cell array are compared to a previously computed verification code, such as a cyclic redundancy check, to determine if errors exist within the configuration logic. If an error is detected, for example, as can be caused by an alpha particle changing the state of a CRAM cell (a "Single Event Upset" or SEU), the values stored in the configuration logic may be modified by an error correction block to correct the error, and a flag may be set indicating the error condition.

Conventional methods of reconfiguration allow a PLD to store a design state or a user defined state. When storing a user defined state, the PLD and its associated configuration logic may operate as user RAM, or as a shift register. User modification of values stored in the configuration logic results in inconsistencies with values represented by the verification code associated with the configuration logic. Consequently, errors result during data verification and correction processes. Thus, conventional methods of reconfiguration require that an entire region of configuration logic, such as an entire column of CRAM cells, stores either a design state, or a user defined state, but not both if detection and potential correction of SEU events are desired. For example, if a column of CRAM cells storing configuration logic associated with a PLD is being reconfigured, that column of CRAM cells may not contain any configuration logic used as user RAM. If user RAM is included in the column of CRAM cells, user-introduced modification of the values stored in the CRAM will cause verification errors during data verification and correction processes.

According to one aspect of the present disclosure, a region of configuration logic, such as a column of CRAM cells, may store both a design state and a user defined state without causing verification errors. For example, if storing a design state, the configuration logic associated with a logic block, such as a logic array block within a PLD, is included in data verification and correction processes. However, if the configuration logic is storing a user defined state, the configuration logic associated with the logic block is excluded from data verification and correction processes. Thus, the exclusion of subsets of a region of configuration logic may allow the region of configuration logic to store both a design state and a user defined state without causing deleterious effects, such as errors, during the data verification and correction processes.

According to another aspect of the present disclosure, if configuration logic stores a user defined state, the user defined state is not disturbed by data verification and correction processes. For example, if a mode flag, which may be a value stored in a RAM cell, indicates that a portion, or subset, of the configuration logic associated with a logic block is storing a user defined state, the error correction block is prevented from writing to that portion of the configuration logic associated with the mode flag. Consequently, the values stored in the user defined state are not disturbed by the error correction block during data verification and correction processes, and the user defined state is preserved.

FIG. 1 is a schematic of a programmable logic device that may be used during partial reconfiguration. According to various embodiments, PLD 100 includes a plurality of logic blocks 101 arranged in rows and columns. Each logic block 101 may further comprise a plurality of columns of logic elements 102 and a plurality of CRAM cells 103 associated with the logic elements 102. The logic blocks 101 may further include mode flag 104 associated with logic block 101. Local interconnect 105 connects logic elements 102 to each other. Local interconnect 105 is connected to routing interconnect 106. Routing interconnect 106 is connected to device interface 107.

PLD 100 may be programmed with various functionalities depending upon the configuration of logic blocks 101 within PLD 100. Thus, reconfiguration of logic blocks 101 results in reconfiguration of PLD 100 and a change in the functionality of PLD 100. According to various embodiments, PLD 100 may be partially reconfigured. That is, some logic blocks 101 may remain static and continue executing existing functionality according to existing programming, while other logic blocks 101 may be reconfigured with new programming and execute a new functionality. In some embodiments, some logic blocks 101 within PLD 100 are configured in a design state as a look-up-table (LUT) while other logic blocks 101 are configured in a user defined state as user RAM. Thus, PLD 100 may concurrently store both a design state and a user defined state, enabling both design functionality and user-defined functionality respectively.

In various embodiments, CRAM cells 103 may store values indicating the state of logic elements 102. For example, CRAM cells 103 may store a design state. When storing a design state, the values stored in CRAM cells 103 control the logic of logic elements 102 and logic block 101 as a whole. For example, if logic block 101 is operating as a LUT, the values stored in CRAM cells 103 indicate the values of logic elements 102, which in turn indicate the values of the LUT. Additionally, CRAM cells 103 may store a user defined state. When storing a user defined state, CRAM cells 103 operate as user RAM. When in this configuration, logic block 101 functions as user RAM. Thus, CRAM cells 103 associated with logic elements 102 indicate the operation of logic elements 102, which in turn indicate the functionality of logic block 101. In various embodiments, a memory cell such as a RAM cell, latch, or register may store mode flag 104 that indicates whether or not logic block 101 and its associated CRAM cells 103 are storing a user defined state or a design state.

According to various embodiments, CRAM cells 103 may be included in a CRAM cell array associated with PLD 100. The CRAM cell array may further include additional CRAM cells associated with logic block 101 that control other aspects of the operation of logic block 101, such as local routing and associated global routing. Moreover, CRAM cells stored in the CRAM cell array may indicate the state stored by mode flag 104. Thus, according to various embodiments, during a data verification and correction process, mode flag 104 may protect values stored in CRAM cells 103 that indicate the values of logic elements 102, as discussed in greater detail below. However, mode flag 104 does not affect the state stored by other CRAM cells included in the CRAM cell array associated with logic block 101, such as those controlling local and global routing of logic block 101.

It will be appreciated that logic block 101 is merely exemplary and in no way should be construed as limiting the present application. For example, logic block 101 may comprise a plurality of columns of logic elements 102. Additionally, CRAM cells 103 may be associated with one or multiple columns of logic elements 102 in one or multiple logic blocks 101. The CRAM cells need not necessarily be RAM cells, but may be some other storage medium, such as a latch or a register.

Moreover, while the present disclosure describes a user defined state operating as user RAM, a user defined state could store any information provided by a user and perform any functionality provided by a user. For example, when in the user defined state, a PLD and its associated configuration logic may operate as a shift register instead of user RAM. When in this configuration, the user defined state functions as a shift register by storing and shifting data provided to the PLD. Thus, according to various embodiments, if a column of CRAM stores both a design state and a user defined state, the column of CRAM may contain configuration logic operating as both a look-up-table and a shift register.

According to various embodiments, routing interconnect 106 connects local interconnect 105 within logic block 101 to device interface 107. Thus, routing interconnect 106 may allow various logic blocks 101 within PLD 100 to communicate with each other and with external components via device interface 107. Device interface 107 allows PLD 100 to communicate with external circuitry.

Figure 2:
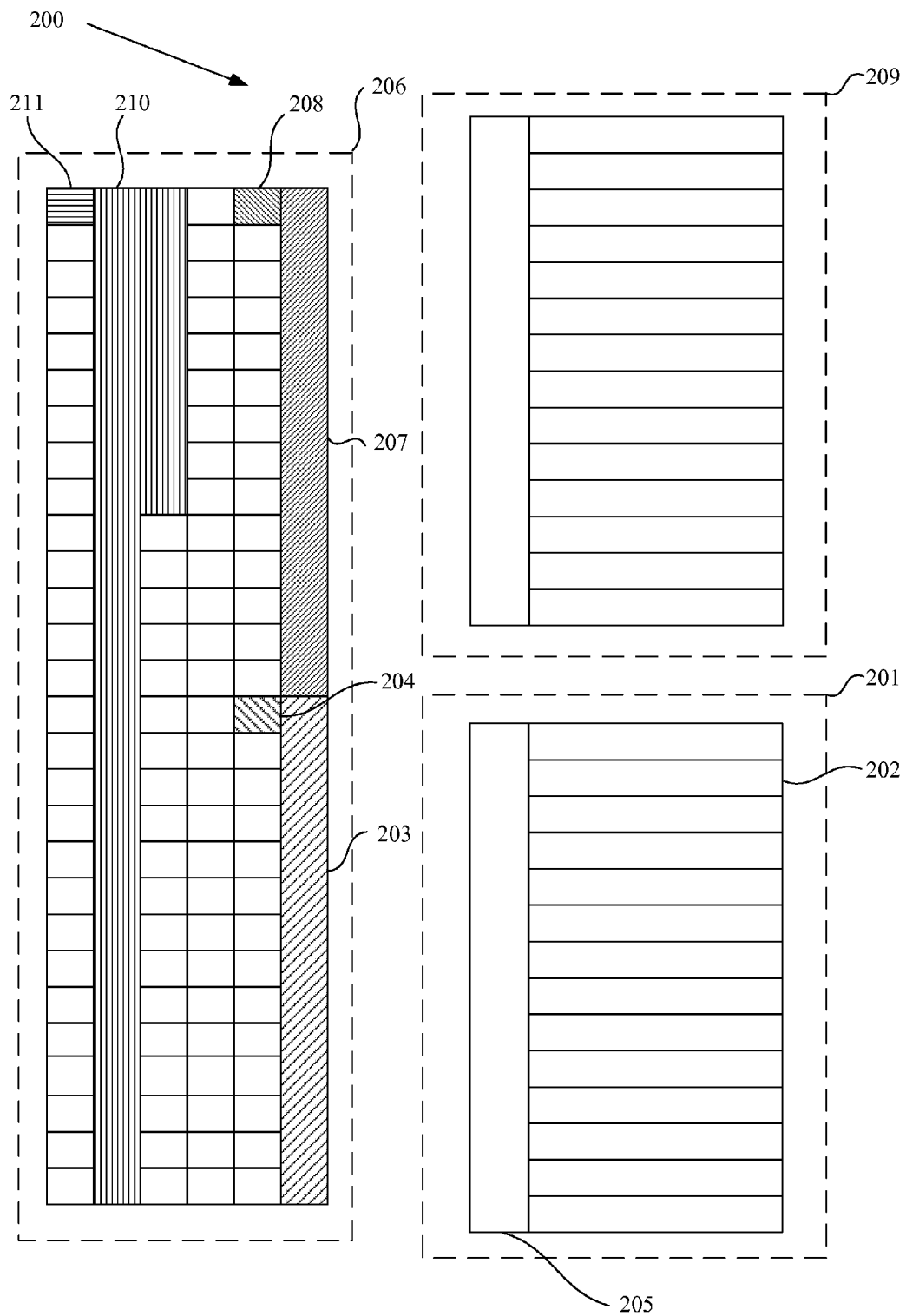
FIG. 2 is a schematic of configuration logic and logic blocks within a programmable logic device.

FIG. 2 is a schematic of configuration logic and logic blocks within a programmable logic device. In various embodiments, logic block 201 includes logic elements 202 which may be arranged as a column of logic elements. Logic block 201 may also include local interconnect 205 which allows logic elements 202 to communicate with each other. CRAM cells 203 and mode flag 204 may reside within CRAM cell array 206 and are associated with logic block 201. CRAM cells 207 and mode flag 208 may reside within CRAM cell array 206 and are associated with logic block 209. Additionally, CRAM cells 210 and mode flag 211 may reside within CRAM cell array 206.

In various embodiments, logic elements 202 function as basic logic building blocks for implementing user defined logic functions. More specifically, logic elements 202 may be configured to function as various logic gates which may store a design state, such as a look-up-table. Logic element 202 may include a look-up-table and a plurality of flip-flops. The look-up-table within logic element 202 may control operation of logic element 202 by determining the input and output values of logic element 202. According to various embodiments, logic element 202 may cover any element that takes CRAM to implement a user function, and could be a look-up-table, an incomplete look-up-table, a programmable CPU, or any other functionality based on values stored in CRAM cells.

According to particular embodiments, CRAM cells 203 store values containing the programming of logic elements 202 associated with logic block 201. The values stored in CRAM 203 may provide the values of the look-up-table stored within logic elements 202, which may be a design state. For example, if logic element 202 includes a 6 input look-up-table, a 64 bit value would be stored in CRAM cells 203 indicating the values of the look-up-table.

In various embodiments, CRAM cells 203, 207 and 210 reside in CRAM cell array 206. CRAM cell array 206 may consist of a plurality of rows and columns of CRAM cells comprising all CRAM used by PLD 200. A single column of CRAM cells within CRAM cell array 206 may contain CRAM cells associated with more than one logic block within PLD 200. As illustrated in FIG. 2, CRAM cells 203 associated with logic block 201 may reside in the same column of CRAM cells as CRAM cells 207 associated with logic block 209. Thus, the configuration logic associated with one logic block may reside within the same column of CRAM as the configuration logic associated with another logic block. Additionally, the CRAM cells for a single logic block may occupy more than one column of RAM cells and be stored across multiple columns of CRAM cells in CRAM cell array 206. For example, CRAM cells 210 may be associated with a single logic block and may occupy more than one column of CRAM cells in CRAM cell array 206.

Because the values stored in CRAM cell array 206 may be used for the configuration and operation of logic block 201 and PLD 200 as a whole, in some embodiments, CRAM cell array 206 or a subset is protected from errors, such as a single event upset (SEU) due to alpha particles, which could potentially result in a catastrophic error in the operation of PLD

200. For example, mode flags such as CRAM cells 204, 208, and 211 may be protected by hardening techniques such as triple modular redundancy, in which 3 redundant copies of a value are stored and supplied to a voting circuit so that an error in one cell will not affect the value represented by the output of the voting circuit. Other techniques may also be used, such as the use of a higher voltage, larger gate area, protective capacitors, or the use of a 12 transistor cell instead of a 6 transistor cell.

In various embodiments, mode flags 204, 208, and 211 indicate if CRAM cells 203, 207, and 210 store a design state or a user defined state respectively, and if they are included in the calculation of the CRC. For example, if the value stored in mode flag 204 indicates that CRAM cells 203 store a design state, CRAM cells 203 may operate as a look-up-table for logic elements 202 associated with CRAM cells 203. Alternatively, if the value stored in mode flag 204 indicates that CRAM cells 203 store a user defined state, CRAM cells 203 may operate as user RAM. Accordingly, if mode flag 208 indicates that CRAM cells 207 store a design state and mode flag 204 indicates that CRAM cells 203 store a user defined state, a single column of CRAM cells in CRAM cell array 206 may include multiple portions or subsets of configuration logic each storing either a user defined state or a design state without causing errors. Furthermore, the CRAM cells 203, 207, and 210 may include values that contain a routing configuration that should always be checked by the data verification and correction process. Moreover, the CRAM cells 203, 207, and 210 may also include other values that are either a LUT configuration or store a user state. In this case, the mode flags would only affect what happens to the subset of CRAM cells that are associated with LUT configuration or hold user state, but would not affect those cells associated with the routing.

As shown in FIG. 2, mode flag 204 may be located in a separate column of CRAM cells than CRAM cells 203 associated with mode flag 204. The same may be true for mode flags 208 and 211. According to various embodiments, each mode flag may also be located in the same column of CRAM as the configuration logic associated with the mode flag. Thus, a mode flag may be located in the same or different region of configuration logic as the configuration logic associated with the mode flag.

It will be appreciated that a mode flag may comprise a single bit of data indicating the mode of operation of a logic block. Alternatively, such functionality may be represented by a plurality of bits. Additionally, the functionality of the mode flags need not be accomplished by a separate RAM cells, but may be stored in another storage medium, such as a register, or may even be accomplished through some form of encoding. Furthermore, a mode flag may be associated with multiple regions of configuration logic. For example, mode flag 208 may be associated with both CRAM cells 207 and CRAM cells 203. Additionally, a mode flag may be associated with one logic block, or a plurality of logic blocks. For example, a mode flag may indicate whether or not 5 logic blocks store a design state or a user defined state. Alternatively, a mode flag may correspond to a single logic element within a logic block and indicate whether or not that particular logic element stores a design state or a user defined state.

Figure 3:
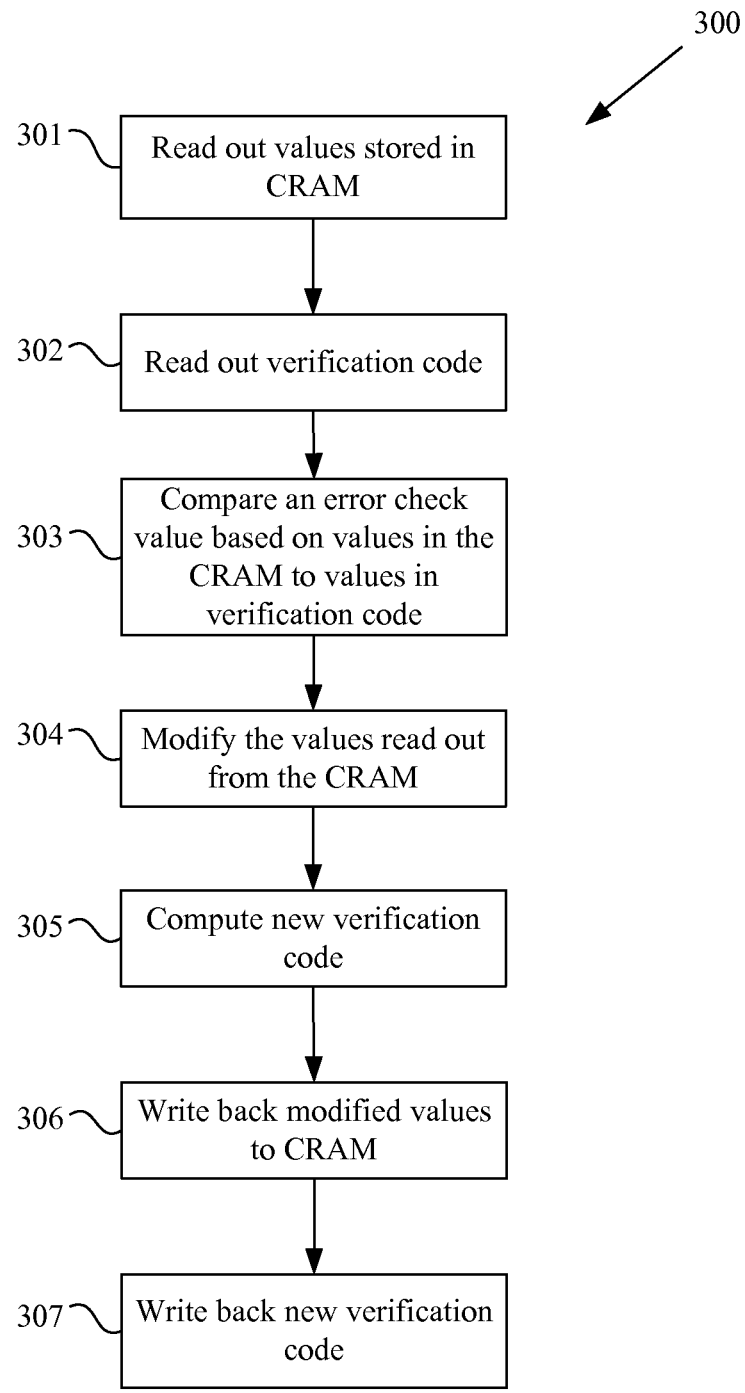
FIG. 3 is a process flow diagram depicting a process of reconfiguration where configuration logic stores a design state.

FIG. 3 is a process flow diagram depicting a process of reconfiguration where configuration logic stores a design state. The process 300 may involve verification and correction of the values currently stored in configuration logic such as CRAM, and subsequent modification of the values stored in the configuration logic if desired (partial reconfiguration).

In various embodiments, values stored in CRAM are read out to an error correction block at 301. The error correction block may periodically read out values stored in columns of CRAM within CRAM cell array 206 to check for errors and maintain the integrity of the values stored in CRAM cell array 206. As illustrated in FIG. 2, each column of CRAM may include CRAM cells associated with more than one logic block. When the values from an entire column of CRAM within CRAM cell array 206 are read out to the error correction block, the CRAM cells associated with a plurality of logic blocks may be read out at once.

In various embodiments, the verification code is read out to the error correction block at 302. The verification code may be computed by the error correction block based upon existing values stored in the CRAM. The verification code may then be stored for future comparison with the values stored in the CRAM. The verification code may be a cyclic redundancy check (CRC), a Forward Error Correction code (FEC) such as a Turbo code or any other hash function used to compute a verification code. The verification code may also employ any other method of computation used for the purpose of data verification and correction that would be appreciated by one of skill in the art.

According to particular embodiments, at step 303 the error correction block may compute an error check value based on the values read out of the CRAM in step 301. The error correction block may then compare the verification code values to the error check values. This comparison may be performed to verify the values stored in the CRAM. If the values stored in the CRAM and the values represented by the verification code do not match, the error correction block may indicate that an error has occurred. If an error is present, it may be possible to correct the error through a conventional error correcting technique associated with the type of verification code used.

In various embodiments, at 304, the PLD may undergo partial reconfiguration by modifying the values read out from the CRAM. If reconfiguration happened, then at 305, a new verification code may be computed based upon the modified CRAM values. At 306, the modified CRAM values are then written back to the CRAM. At 307, the modified verification code is written back to the RAM cells associated with the verification code.

Figure 4:
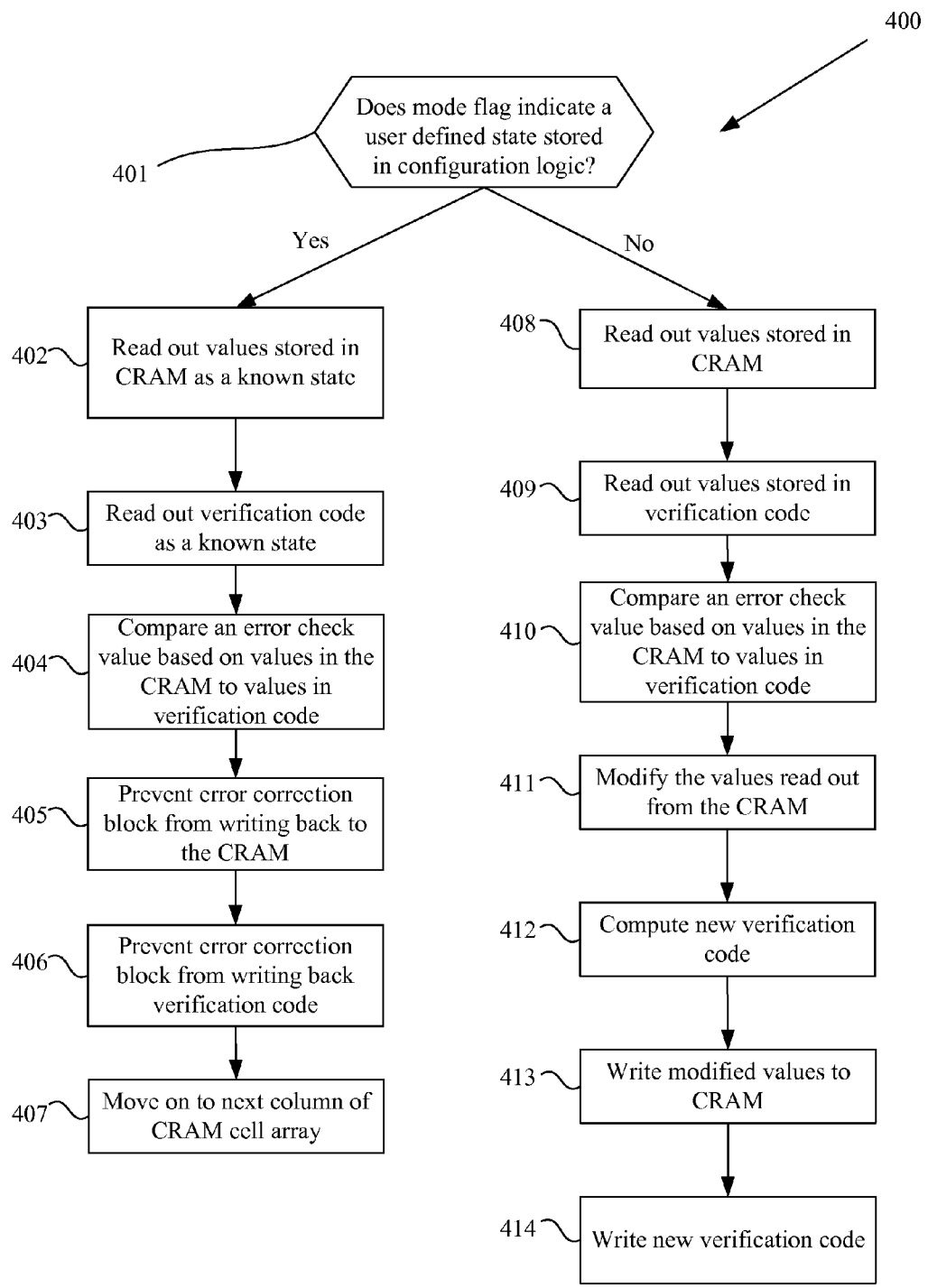
FIG. 4 is a process flow diagram depicting a process of reconfiguration where a mode flag indicates if the configuration logic stores a user defined state or a design state.

FIG. 4 is a process flow diagram depicting a process of reconfiguration where a mode flag indicates if configuration logic stores a user defined state or a design state. In various embodiments, the value stored in the mode flag indicates if configuration logic associated with a particular logic block stores a user defined state or a design state. At 401, the value stored in a mode flag may be evaluated.

In various embodiments, if the mode flag indicates that the logic block is storing a user defined state, at 402 the values stored in the CRAM cells associated with the logic block may be read out to the error correction block as a known state. For example, the values stored in the CRAM cells may be read out as all zeros. According to particular embodiments, if the mode flag indicates that the logic block is storing a user defined state, at 403 the verification code associated with the values stored in the CRAM may also be read out to the error correction block as a known state. Thus, at this point in process 400, both the values stored in CRAM and the verification code are read out as a known state, such as all zeros.

In particular embodiments, at 404, the error correction block may compare an error check value associated with the values stored in CRAM and the verification code to determine if an error has occurred. At this point in the process, both the values stored in the CRAM and the values of the verification code associated with the CRAM have been read out as a known state. Because the two sets of values compared by the error correction block are the same (i.e. the known state), no error results.

In various embodiments, the error correction block may not write to the CRAM cells associated with the logic block when the mode flag indicates that the logic block is operating in a user defined state. Thus, after evaluating the two sets of values, at 405 the control block may be prevented from writing values back to the CRAM. Consequently, according to various embodiments, the user defined state stored in the CRAM cells is not disturbed, and real time changes made by a user are protected. At 406, the control block may be prevented from writing values back to the RAM cells associated with the verification code. At 407, the control block may move on to the next column of CRAM without the occurrence of an error.

Thus, by indicating that a logic block is operating in a user defined state, the mode flag may exclude the values stored in the CRAM cells associated with the logic cells from data verification and correction processes. For example, if storing a user defined state, the values stored in the CRAM cells associated with the logic cell and the values of the verification code may be read out as a known state. Consequently, the error correction block compares only the values of the known state and does not indicate an error. Moreover, the error correction block may be prevented from modifying the values stored in the CRAM cells. Consequently, in various embodiments the values stored by the user in the user defined state are not disturbed.

In particular embodiments, the mode flag may be positioned so that there is minimal time between scanning and potential correction of the mode flag and scanning and potential correction of the CRAM cells associated with the mode flag. For example, the mode flag may be placed exactly one column to the left of the column in which the CRAM cells associated with the mode flag reside. Thus, according to various embodiments, when a left-to-right scan is performed during data verification and correction processes, the time between scanning the mode flag and scanning the CRAM cells associated with the mode flag is minimized. Minimizing the time between scanning the mode flag and scanning the CRAM cells associated with the mode flag minimizes the instances of errors in the mode flag, such as an SEU, that may occur after the mode flag has been scanned, but before its associated CRAM cells have been scanned. If such an error in the mode flag were to occur, the CRAM cells associated with the mode flag may be erroneously included or excluded from the data verification process. It will be appreciated that the same may be true if the mode flag is located one column to the right of the CRAM cells associated with the mode flag and a right-to-left scan is performed.

According to various embodiments, if the mode flag indicates that the logic block is storing a design state, reconfiguration may occur as previously described. At 408, a column of values stored in the CRAM cells may be read out to the error correction block. At 409, the values of the verification code associated with the column of CRAM cells may be read out to the error correction block. At 410, the error correction block may then compare an error check code associated with the values stored in CRAM and the verification code to see if an error has occurred. At 411, during a partial reconfiguration operation, the values stored in the column of CRAM may be modified to include a new design state. At 412, a new verification code may be computed based on the modified CRAM values. At 413, the modified CRAM values may be written back to the CRAM column. At 414, the new verification code may be written back to the RAM cells associated with the verification code.

Thus, depending on the value stored in the mode flag, the CRAM cells associated with logic blocks that store a design state may be verified and checked for errors according to data verification and correction processes, while the CRAM cells associated with logic blocks that are storing a user defined state may be excluded from data verification and correction processes. Consequently, according to various embodiments, a single column of CRAM in a CRAM cell array may store both a design state and a user defined state without an error resulting. Moreover, in various embodiments the user defined state is not disturbed by the data verification and correction processes.

Furthermore, according to particular embodiments, the logic block and configuration logic associated with the logic block may be configured to change the values stored in the configuration logic from a user defined state to a known state in response to an input provided by a user. For example, this may be accomplished by providing a switch operable by a user. Activation of the switch may multiplex the output of the configuration logic with a known state. The known state may be, for example, all zeros. Thus, by activating this switch, a user may indicate that zeros are stored in the configuration logic. Once this has been accomplished, the logic block may freely transition between storing a user defined state and storing a design state without incurring a data verification error. Thus, according to some embodiments, in response to user input, the PLD may dynamically transition between storing a user defined state and a design state such that the data verification and correction processes may read the same values, such as the known state, during the transition and does not register an error. Moreover, this may be accomplished regardless of whether the mode flag indicates that actual values stored in the configuration logic or a known state should be read out to the error correction block.

Figure 5:
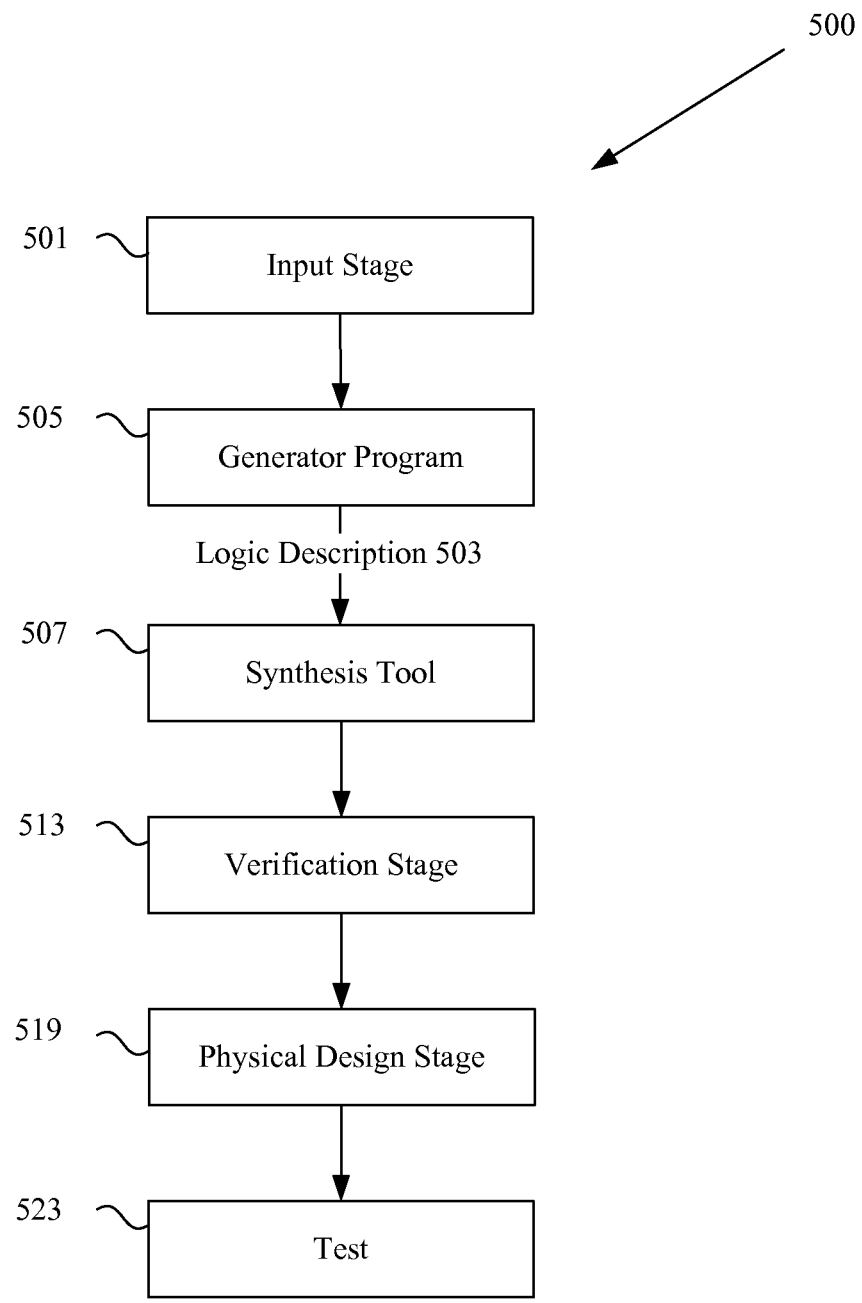
FIG. 5 illustrates a technique for implementing a programmable chip.

FIG. 5 illustrates a technique for implementing a programmable chip. An input stage 501 receives selection information typically from a user for logic such as a processor core as well as other components to be implemented on an electronic device. In one example, the input received is in the form of a high-level language program. A generator program 505 creates a logic description and provides the logic description along with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of hard coded logic. In some examples, components provided to an input stage include intellectual property functions, megafunctions, and intellectual property cores. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected. At this stage, the user may enter security information about individual components that needs to be isolated. For example, different levels of component security and which components are allowed to communicate with each other may be entered.

In typical implementations, the generator program 505 can identify the selections and generate a logic description with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. One tool with generator program capabilities is System on a Programmable Chip (SOPC) Builder available from Altera Corporation of San Jose, Calif. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
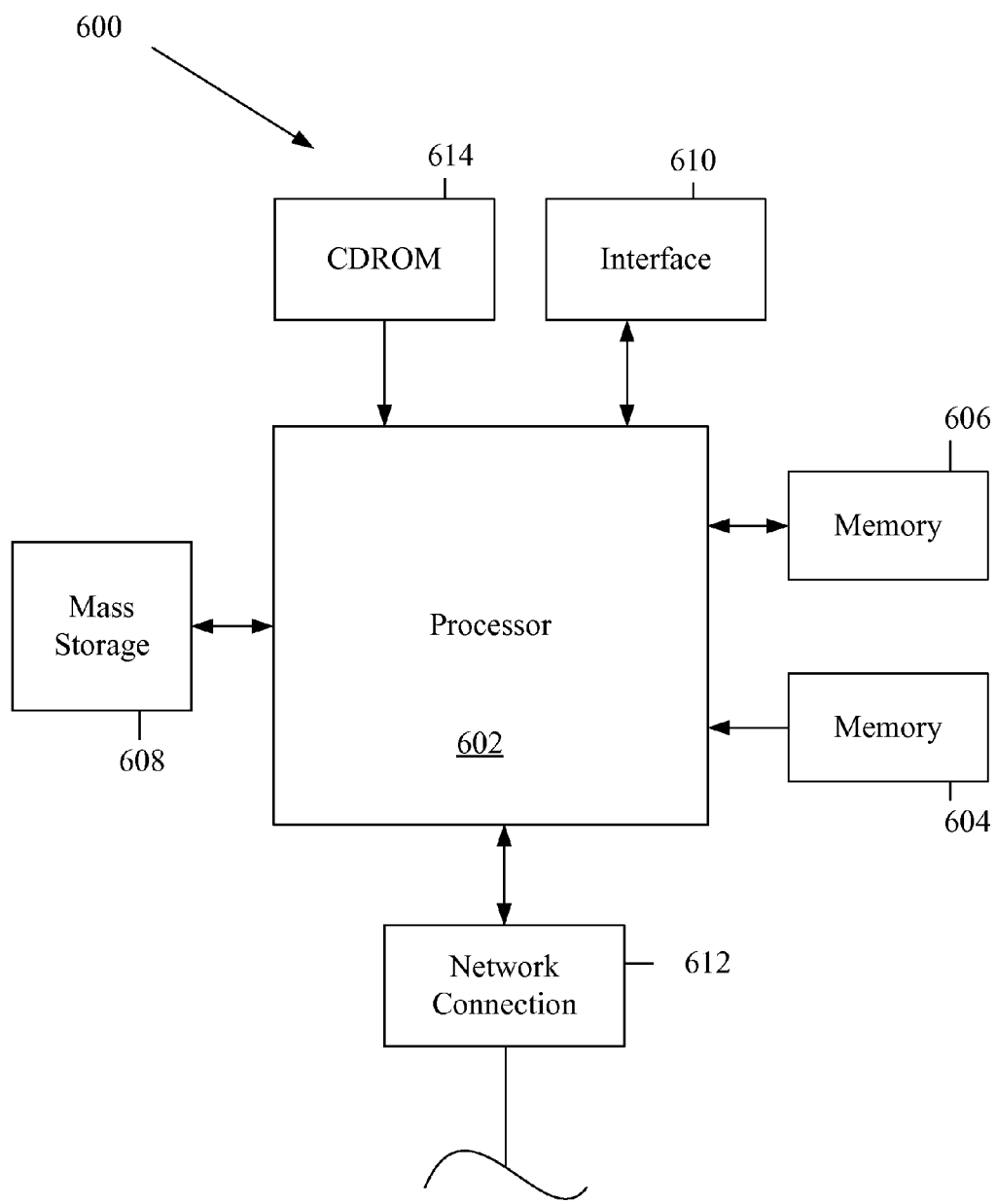
FIG. 6 illustrates one example of a computer system.

FIG. 6 illustrates one example of a computer system. The computer system 600 includes any number of processors 602 (also referred to as central processing units, or CPUs) that are coupled to devices including memory 606 (typically a random access memory, or "RAM"), memory 604 (typically a read only memory, or "ROM"). The processors 602 can be configured to generate an electronic design. As is well known in the art, memory 604 acts to transfer data and instructions uni-directionally to the CPU and memory 606 are used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 602 may be a design tool processor. Finally, CPU 602 optionally may be coupled to a computer or telecommunications network using a network connection as shown generally at 612. With such a network connection, it is contemplated that the CPU might receive information from the network, or might output information to the network in the course of performing the above-described process steps. It should be noted that the system 600 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A device comprising:
   a logic block, wherein the logic block includes a plurality of logic elements;
   configuration logic associated with the logic block, wherein the configuration logic stores values for the plurality of logic elements included in the logic block; and
   a memory cell storing a mode flag, wherein the mode flag identifies whether the configuration logic stores a user defined state or a design state, wherein the configuration logic is excluded from a data verification and correction process when storing a user defined state, and wherein the configuration logic is included in the data verification and correction process when storing a design state, wherein the mode flag is protected by triple modular redundancy, larger gate area, protective capacitors, or the use of increased voltage.

2. The device of claim 1, wherein excluding the configuration logic from the data verification and correction process prevents the data verification and correction process from modifying the configuration logic.

3. The device of claim 1, wherein the mode flag is positioned to minimize the time between scanning of the mode flag and scanning of the configuration logic associated with the mode flag during the data verification and correction process.

4. The device of claim 1, wherein the logic block operates as user-defined random access memory or as a shift register in response to the configuration logic storing a user defined state.

5. The device of claim 1, wherein the logic block is a field programmable gate array (FPGA) logic block, and wherein the memory cell is a random access memory cell, a latch, or a register.

6. The device of claim 1, wherein the mode flag comprises a single bit of data.

7. A device comprising:
   a plurality of logic blocks, wherein each of the plurality of logic blocks includes a plurality of logic elements;
   configuration logic associated with the plurality of logic blocks, wherein the configuration logic stores values for a plurality of logic elements included in the plurality of logic blocks, wherein the configuration logic is stored within a configuration random access memory (CRAM) cell array including a plurality of columns of CRAM cells,
   wherein the configuration logic includes a plurality of subsets of configuration logic, each of the plurality of subsets of configuration logic being associated with one of the plurality of logic blocks, and
   wherein each of the plurality of subsets of configuration logic includes a memory cell storing a mode flag, wherein the mode flag identifies whether the configuration logic stores a user defined state or a design state, wherein the configuration logic is excluded from a data verification and correction process when storing a user defined state, and wherein the configuration logic is included in the data verification and correction process when storing a design state.

8. The device of claim 7, wherein excluding the configuration logic from the data verification and correction process prevents the data verification and correction process from modifying values stored in the configuration logic.

9. The device of claim 7, wherein the configuration logic occupies more than one column of CRAM cells in the CRAM cell array.

10. The device of claim 7, wherein the mode flag identifies whether configuration logic associated with a plurality of logic blocks stores a user defined state or a design state.

11. The device of claim 7, wherein the mode flag is positioned to minimize the instances of errors in the value stored in the mode flag that may occur during the time between scanning of the mode flag and scanning of the configuration logic associated with the mode flag during the data verification and correction process.

12. The device of claim 7, wherein the mode flag is protected by triple modular redundancy, larger gate area, protective capacitors, or the use of increased voltage.

13. The device of claim 7, wherein a subset of the configuration logic is stored in a column of CRAM other than a column of CRAM storing the mode flag associated with the subset of configuration logic.

14. The device of claim 7, wherein the logic block, configuration logic, and memory cell are operable to transition between a design state and a user defined state without causing verification errors by:
   changing values stored in the configuration logic from a user defined state to a known state in response to an input provided by a user; and
   reading out a known state during the data verification and correction process in response to an input provided by a user.

15. A method for reconfiguring configuration logic storing values associated with a plurality of logic elements included in a logic block, the method comprising:
- reading a mode flag associated with configuration logic;
- determining whether the mode flag indicates that a user defined state is stored in the configuration logic;
- in response to determining that the mode flag indicates a user defined state:
  - reading out values stored in the configuration logic as a known state;
  - computing an error check code associated with the values stored in the configuration logic based on the known state;
  - reading out the values of a verification code associated with the configuration logic as a known state; and
  - comparing the error check code to the verification code.

16. The method of claim 15 further comprising:
- determining whether the mode flag indicates that a design state is stored in the configuration logic;
- in response to determining that the mode flag indicates a design state:
  - reading out values stored in the configuration logic;
  - modifying the values stored in the configuration logic to create modified configuration logic values;
  - computing a verification code based on the modified configuration logic values; and
  - writing the modified configuration logic values to a CRAM cell array.

17. The method of claim 15, wherein the data verification and correction process is prevented from modifying the configuration logic in response to determining that the mode flag indicates a user defined state.

18. The method of claim 15, wherein the mode flag is positioned to minimize the time between scanning of the mode flag and scanning of the configuration logic associated with the mode flag during the data verification and correction process.

19. The method of claim 15, wherein the mode flag is protected by triple modular redundancy, larger gate area, protective capacitors, or the use of increased voltage.

* * * * *